United States Patent
Trevor

(10) Patent No.: US 10,784,094 B2
(45) Date of Patent: Sep. 22, 2020

(54) HARMONIC LINE NOISE CORRECTION FOR ELECTRON ENERGY LOSS SPECTROMETER

(71) Applicant: Gatan, Inc., Pleasanton, CA (US)

(72) Inventor: Colin Trevor, Pleasanton, CA (US)

(73) Assignee: Gatan, Inc., Pleasanton, CA (US)

( * ) Notice: Subject to any disclaimer, the term of this patent is extended or adjusted under 35 U.S.C. 154(b) by 0 days.

(21) Appl. No.: 16/480,379

(22) PCT Filed: Feb. 1, 2018

(86) PCT No.: PCT/US2018/016373
§ 371 (c)(1),
(2) Date: Jul. 24, 2019

(87) PCT Pub. No.: WO2018/144690
PCT Pub. Date: Aug. 9, 2018

(65) Prior Publication Data
US 2019/0362953 A1    Nov. 28, 2019

Related U.S. Application Data

(60) Provisional application No. 62/454,263, filed on Feb. 3, 2017.

(51) Int. Cl.
*H01J 49/02* (2006.01)
*H01J 49/46* (2006.01)

(52) U.S. Cl.
CPC ......... *H01J 49/022* (2013.01); *H01J 49/025* (2013.01); *H01J 49/463* (2013.01)

(58) Field of Classification Search
USPC ..................................................... 250/305
See application file for complete search history.

(56) References Cited

U.S. PATENT DOCUMENTS

| | | |
|---|---|---|
| 3,842,272 A | 10/1974 | Coates et al. |
| 5,224,029 A | 6/1993 | Newman, Jr. |
| 5,347,464 A | 9/1994 | McEachern et al. |
| 7,292,013 B1 | 11/2007 | Chen et al. |
| 7,733,678 B1 | 6/2010 | Notohamiprodjo et al. |
| 8,018,744 B1 | 9/2011 | Wrathall |
| 2002/0096632 A1 | 7/2002 | Kaji et al. |
| 2008/0077336 A1* | 3/2008 | Fernandes ............ G01R 15/142 702/57 |
| 2011/0148202 A1* | 6/2011 | Rada ........................ G05F 1/70 307/52 |

OTHER PUBLICATIONS

PCT International Search Report and Written Opinion issued for the corresponding international application No. PCT/US2018/0163373, dated Jun. 14, 2018, 8 pages.

* cited by examiner

*Primary Examiner* — Kiet T Nguyen
(74) *Attorney, Agent, or Firm* — Snyder, Clark, Lesch & Chung, LLP

(57) ABSTRACT

Electron Energy Loss Spectrometer including a correction circuit for fundamental and third harmonic line noise is described. Various circuits for creating the correction signals are also described. A method of correcting for fundamental and third harmonic line noise is also described.

20 Claims, 6 Drawing Sheets

HARMONIC LINE NOISE CORRECTION FOR ELECTRON ENERGY LOSS SPECTROMETER

CROSS-REFERENCE TO RELATED APPLICATION

This application claims the benefit under 35 U.S.C. § 371 of International Application No. PCT/US2018/016373, filed Feb. 1, 2018, which claims priority under 35 U.S.C. § 119 based on U.S. Provisional Patent Application No. 62/454,263, filed Feb. 3, 2017, entitled HARMONIC LINE NOISE CORRECTION FOR ELECTRON ENERGY LOSS SPECTROMETER, the disclosures of which are both hereby incorporated by reference herein.

BACKGROUND

Electron Energy Loss Spectrometry (EELS) spectrum acquisition in a transmission electron microscope (TEM) exposes a sensor with a spectrum of electrons that have traversed (i.e., traveled through) a thin specimen. EELS is typically practiced on Transmission Electron Microscopes (TEM) at 200-300 kV operating voltage and around 1 eV energy resolution. Recently, there has been a drive to much lower operating voltage (e.g. 15 kV) and higher energy resolution (e.g. 5 meV). The electron energy-loss spectrum extends from 0 to many keVs energy-loss. The intensity of the energy-loss spectrum falls off rapidly with energy loss, and EELS studies are typically limited to about 3 keV energy loss. This range is expected to increase in the future with improvements in detector technology.

With reference to FIG. 1, in the typical prior art electron energy loss spectrometer, an electron beam 5 emerges from a transmission electron microscope 1 and enters the spectrometer through an aperture 10. A bending magnet 13 bends the electron beam over an angle, typically 90 degrees, to introduce energy dispersion. The resulting energy-loss spectrum is electron optically magnified, focused and projected by lenses 15, 16, 17 on a purpose-designed electron detector 21. Focusing is important in the dispersion direction, the spectrum is not necessarily focused in the non-dispersion direction. The detector records what is effectively a window on the energy-loss spectrum. This window has a starting and an ending energy-loss. The starting energy loss is typically set by adjusting the TEM high voltage, the magnetic field of the bending magnet, or the voltage on an isolated drift tube 14 through the bending magnets. Adjusting any of these moves the whole energy-loss spectrum relative to the detector to view different regions of interest of the spectrum.

EELS resolution is limited by various sources of noise and fields. A common issue is periodic noise at power line frequencies. This noise can be from electromagnetic fields, ground currents, not fully filtered power supplies or, more likely, a combination of all of these sources. In prior art designs a small amount of line frequency is mixed as a correction signal into the DC field current on the bending magnet 13. By adjusting the phase of the correction signal relative to the power line signal and also adjusting the correction signal amplitude, the EELS stability at frequencies above line frequency and resolution at frequencies below line frequency is improved.

In prior art implementations, the source waveform is derived from either the power line via a transformer or resistor divider, or from a sensing coil to sense electromagnetic fields. On high resolution EELS systems, after the line frequency is corrected, a further noise issue is the third harmonic. In countries with electrical power systems based on 60 Hz, including the United States, the third harmonic of the line frequency is 180 Hz, while in countries with electrical power systems based on 50 Hz, the third harmonic of the line frequency is 150 Hz. The third harmonic, like the line frequency, can come from a number of sources including, fields, stray ground current and residual ripple on power supplies. Noise introduced by field can be corrected using a coil as a sensor approach, while line frequency nose can be corrected by using the line voltage as a reference

SUMMARY OF THE INVENTION

An aspect of the invention is an electron energy loss spectrometer (EELS) operating from an alternating current (AC) power line voltage having an AC power line fundamental frequency. The EELS includes: a bending magnet for producing a spectrum of electron energy levels; a direct current bending magnet field excitation source; and a power line noise correction circuit configured to produce a first correction signal at the fundamental AC power line frequency and a second correction signal at a harmonic of the fundamental AC power line frequency. In a further aspect of the invention, the power line noise correction circuit includes a sampling circuit for sampling the AC power line voltage. In a further aspect of the invention the power line noise correction circuit includes an electromagnetic field sensing sampling circuit for indirectly sensing AC power line noise in the vicinity of the EELS. In a further aspect of the invention the second correction signal at the harmonic of the fundamental AC power line frequency is generated independent of the AC power line voltage. In a further aspect of the invention the second correction signal at the harmonic of the fundamental AC power line frequency is produced by waveshaping and filtering either the AC power line signal or a signal proportional to a sensed electromagnetic field at the AC power line frequency. In a further aspect of the invention each of the first and second correction signals are independently adjustable in phase and amplitude. In a further aspect of the invention each of the first and second correction signals are electrically added to the DC bending magnet field excitation source. In a further aspect of the invention each of the first and second corrections signals are coupled to the bending magnet field excitation source with a transformer. In a further aspect of the invention the EELS includes a drift tube and amplitude and phase-adjusted versions of the first correction signal and the second correction signal are applied to a DC voltage powering the drift tube. In a further aspect of the invention the power line noise correction circuit includes: an analog to digital signal converter; a microcontroller; and a digital to analog signal converter, wherein the microcontroller controls the analog to digital signal converter to: sample the AC powerline voltage, and store the samples in a buffer and output the samples from the buffer to the digital to analog signal converter, such that there are produced a fundamental frequency output signal and a harmonic of the fundamental output signal based on the samples of the AC powerline voltage. In a further aspect of the invention harmonic correction signal is the third harmonic of the fundamental AC powerline frequency.

A further aspect of the invention is an alternating current (AC) power line noise correction circuit for producing a correction signal comprising a fundamental AC power line frequency signal and a harmonic of the fundamental AC power line frequency signal. The correction circuit includes: a line voltage sensor configured to produce a line voltage signal; an analog to digital (A/D) signal converter; a microcontroller having a program memory and a read/write buffer memory; and a digital to analog (D/A) signal converter. The microcontroller is configured to: sample the line voltage signal at a sample rate, store samples of the line voltage signal in the read/write buffer memory, read out the samples of the line voltage signal from the read/write buffer memory to create a first read out at the AC power line frequency and a second read out a harmonic of the AC power line frequency, the microcontroller further combines the first and second readouts to produce a combined output value, and outputs the combined output value to the D/A converter to produce a combined correction signal. In a further aspect of the correction circuit, the microcontroller is further configured to phase shift one or both of the first and second readouts of the line voltage signal. In a further aspect of the correction circuit, the microcontroller is further configured to provide individual adjustment of amplitude of one or both of the first and second readouts from the line voltage signal. In a further aspect of the correction circuit harmonic correction signal is for the third harmonic of the line voltage frequency. In a further aspect of the correction circuit the line voltage sensor is a transformer. In a further aspect of the correction circuit, the line voltage sensor is an electromagnetic field sensor. In a further aspect of the invention, the correction circuit is used with an electron energy loss spectrometer (EELS) subject to noise associated with an AC power source, the EELS having: a bending magnet supplied by a bending magnet excitation current, and the combined correction signal is applied to the bending magnet excitation current to correct for the noise associated with an AC power source.

A further aspect of the invention is a method of correcting for AC mains noise in an electron energy loss spectrometer (EELS), the method including the steps of: sampling an AC power line voltage, adjusting amplitude and phase of the AC power line voltage to create a fundamental frequency correction signal, generating a signal at the a harmonic of the AC powerline voltage, adjusting amplitude and phase of the signal at the harmonic of the AC powerline voltage to create a harmonic correction signal and applying the fundamental and harmonic correction signals to a bending magnet in the EELS. In a further aspect of the method, there includes the step of automatically adjusting one or both of the amplitude and phase of one or both of the fundamental and the harmonic correction signals based on feedback from a spectrum detected by the EELS.

BRIEF DESCRIPTION OF THE DRAWINGS

The accompanying drawings, which are incorporated in and constitute a part of this specification, illustrate one or more embodiments described herein and, together with the description, explain the embodiments. In the drawings.

DETAILED DESCRIPTION OF PREFERRED EMBODIMENTS

The following detailed description refers to the accompanying drawings. The same reference numbers in different drawings identify the same or similar elements. Consistent with embodiments described herein, an EELS electron microscope may include a corrector for harmonics of the power line frequency. In some embodiments, noise in the line frequency may still be corrected as in the prior art by adding a small amount of line frequency to the bending magnet DC excitation current. As described below, a second term at three times the line frequency may also be introduced, with user control over the phase shift from the line frequency wave form and amplitude control of the third harmonic signal.

Figure 1:
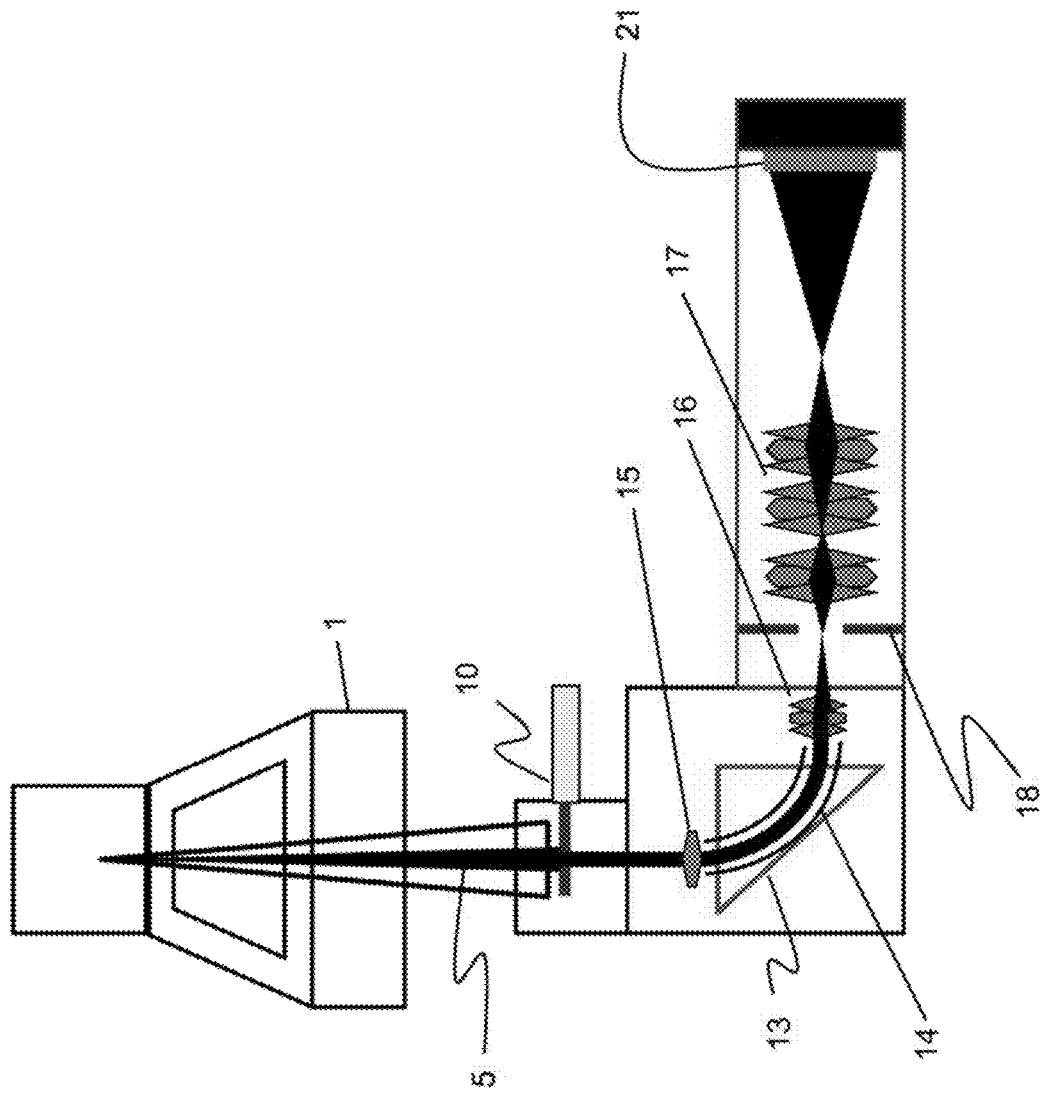
FIG. 1 is diagram of a prior art transmission electron microscope with an electron energy loss spectrometer.
Figure 2:
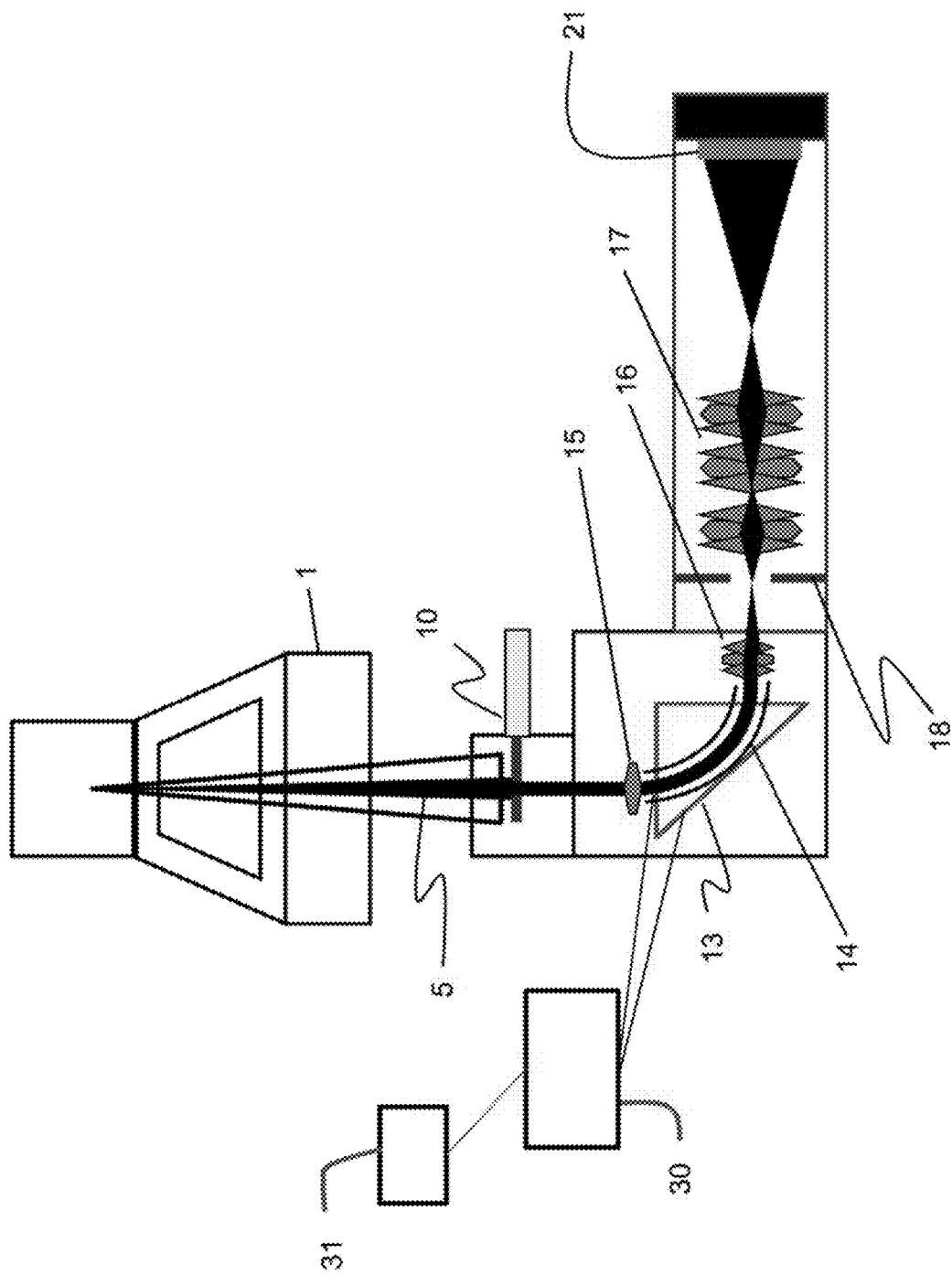
FIG. 2 is a diagram of an exemplary transmission electron microscope with an electron energy loss spectrometer incorporating a third harmonic signal correction circuit.

With respect to FIG. 2, in which like numbered components from a prior art EELS (FIG. 1) are also shown, there is included a third harmonic signal generator 30 to generate a third harmonic waveform. Consistent with the present description, third harmonic signal generator 30 may generate the third harmonic waveform in a variety of ways, including, but not limited to, using a sine table to drive a digital to analog converter, directly calculating in real time the waveform signal to drive a digital to analog converter, filtered pulse width modulation, a free-running analog oscillator, or by squaring or otherwise waveshaping the line frequency waveform and filtering for the harmonic components of the squared line frequency waveform.

Figure 3:
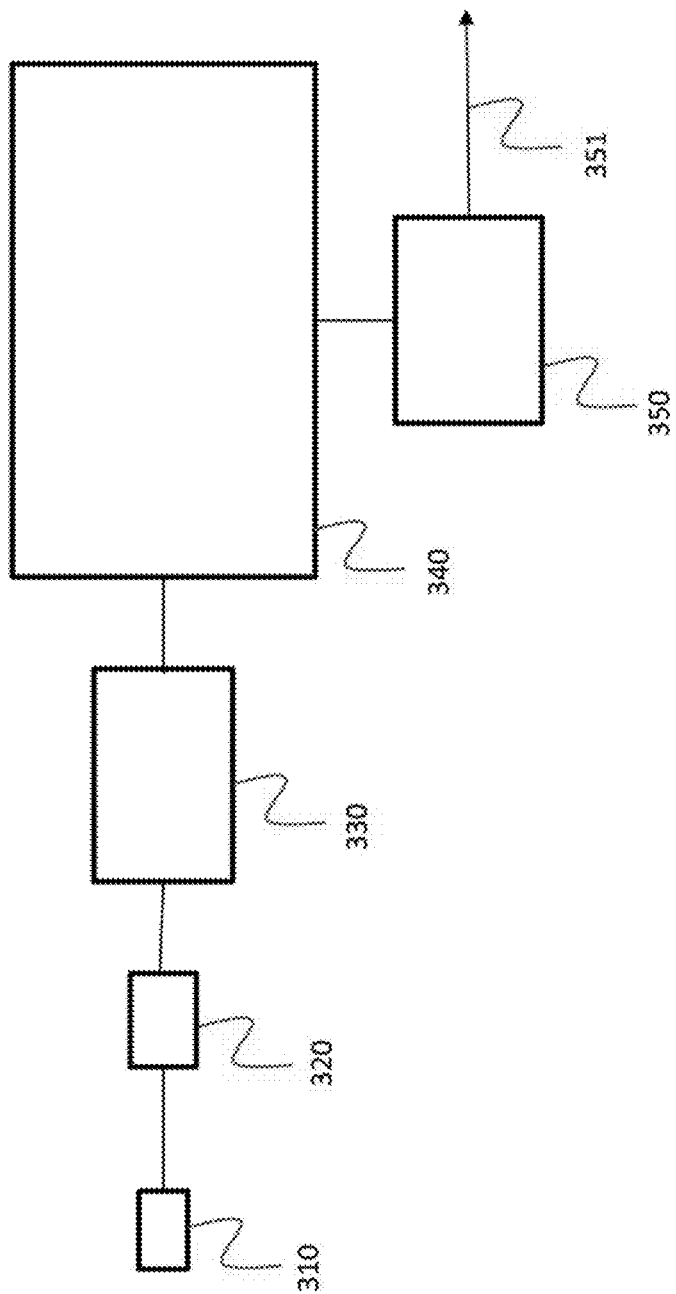
FIG. 3 is a block diagram of an exemplary system for producing fundamental and harmonic correction signals.

In an exemplary embodiment as shown in FIG. 3 and detailed further below, the third harmonic is generated by a microprocessor that has, as an input, the power line signal or a digital representation thereof for reference.

Regardless of the means of generating the third harmonic correction signal, it is also necessary to control and be able to adjust the phase of the signal relative to the line frequency. To accomplish this, the line frequency must be sampled, either directly from the power mains to the EELS, either directly or via a transformer or indirectly with a field sensor 31 to sense the EMF in the area proximate to the EELS.

Phase of the third harmonic correction signal relative to the fundamental line frequency can be controlled in a variety of known ways, including but not limited to an analog op-amp based phase shifter, a phase locked loop, a digital or analog delay line, or in the case of a digitally generated signal, by variably offsetting in time from the fundamental line frequency zero crossing level the voltage values driving the digital to analog converter.

The amplitude of the third harmonic correction signal may be controlled using known means, including a variable gain stage controlled either digitally or in an analog circuit including a variable resistor, for example.

An exemplary system for generating a correction signal having components of the fundamental power line frequency and third harmonic of the fundamental power line frequency is shown in FIG. 3. As shown, power line mains 310 are input to an isolation transformer 320, which also reduces the power line voltage to a signal level more suitable for electronic processing, for example 8 volts peak to peak. The isolated AC mains signal from isolation transformer 320 is sampled by an analog to digital (A/D) converter 330, which is under the control of and provides a digital output to a microcontroller 340. Microcontroller 340 includes embedded program memory and data memory. Microcontroller 340 uses the A/D converter 330 to sample the isolated AC mains input at a sample rate sufficient to accurately reproduce the AC mains signal, which, in one embodiment, may substantially be a sine wave. Microcontroller 340 stores the samples of the AC mains signal in a memory buffer, which can be a ring buffer. The ring buffer stores one or more full cycles of the input fundamental line frequency waveform, sufficient for the microcontroller to read out, i.e., play back a synthesized waveform from the stored one. The use of a ring buffer allows the storage of the input waveform to be continuous, such that when the end of the buffer is reached, storage simply wraps around to the beginning of the buffer. Read out of the buffer is accomplished in a similar manner. Microcontroller 340 reads out the contents of the memory buffer at the sample rate to produce a fundamental frequency AC mains correction signal and also reads out the contents of the memory buffer at three times the sample rate to produce a second correction signal at the third harmonic of the fundamental frequency.

Consistent with embodiments described here, a phase of both the fundamental frequency correction signal and the third harmonic frequency correction signal can be separately adjusted with respect to a zero crossing of the input AC mains signal by shifting where, in the memory buffer, the stored sampled AC mains signal is read out with respect to the zero crossing of the AC mains signal. The read out of the memory buffer for the fundamental frequency signal and the readout for the third harmonic signal may each be multiplied by separate user-input or feedback-generated gain signals, and then summed together to produce a single output value that is output to a digital to analog converter 350, to produce an analog correction signal 351, which is buffered and applied to the EELS bending magnet and/or the EELS drift tube as described herein.

Figure 4:
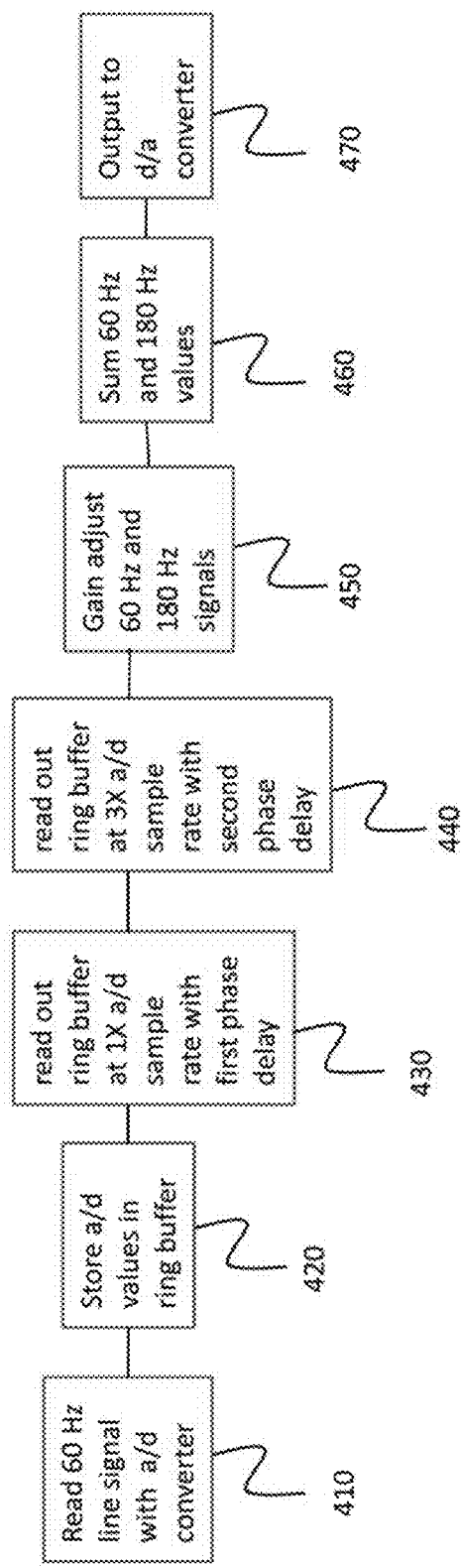
FIG. 4 is a flow diagram for a microcontroller of the system of FIG. 3.

FIG. 4 shows an exemplary flow diagram for the microcontroller 340 of the embodiment described herein with respect to FIG. 3 and for a line frequency of 60 Hz. At step 410, microcontroller 340 periodically reads a sample of the transformer-isolated 60 Hz line signal with A/D converter 320. In an exemplary embodiment, the sample rate is 19.2 KHz. At step 420, microcontroller 340 stores the A/D values in a memory buffer, such as a ring buffer. At step 430, microcontroller 340 reads out the memory buffer values at the A/D sample rate with a first delay used to phase adjust the 60 Hz correction signal with respect to the AC mains power line signal. At step 440, microcontroller 340 reads out the memory buffer values at three times the A/D sample rate (in an embodiment, skipping every second and third value in the memory buffer), with a second delay used to phase adjust the 180 Hz correction signal with respect to the AC mains power line signal.

At step 450, microcontroller 340 gain adjusts the 60 Hz and 180 Hz correction signals according to user input or based on an automated feedback loop. At step 460, microcontroller 340 sums the phase-adjusted and gain-adjusted 60 Hz and 180 Hz correction values. At step 470, summed value is output to a D/A converter 350 for use in correcting the EELS.

Phase and amplitude of the correction signal can be either manually adjusted or automatically adjusted in a feedback loop that includes means for measuring the effect of the third harmonic noise in the output of the EELS.

Figure 6:
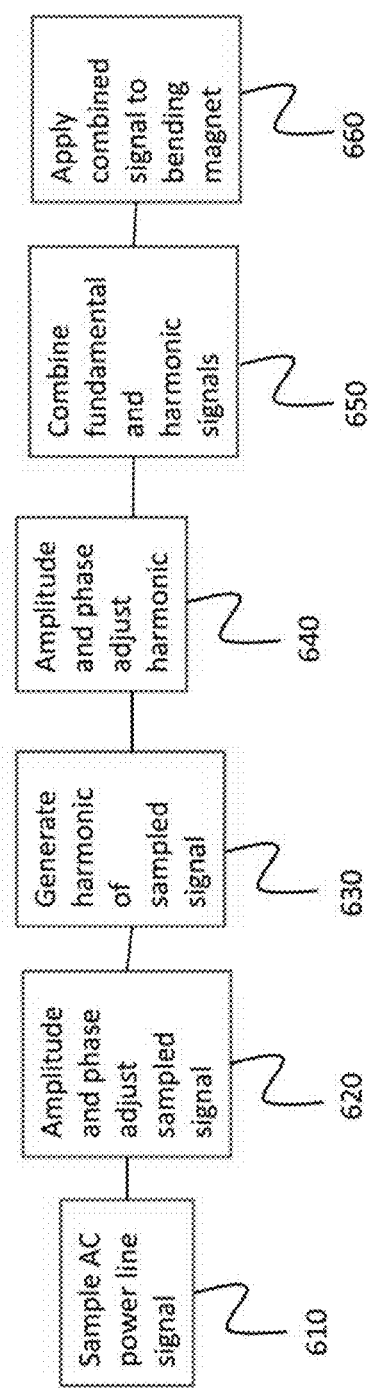
FIG. 6 is a flow diagram of an exemplary method for correcting for power line associated noise in an EELS.

FIG. 6 describes an exemplary method for correcting noise in an EELS related to AC power lines, including noise at a harmonic of the AC power line fundamental frequency.

At step 610, an AC powerline voltage is sampled by the microcontroller via the A/D convertor. For example, the sample can be either directly from a hardwired source or by an electromagnetic field sensor for sending EMF produced by AC power lines in the vicinity of the EELS. At step 620, amplitude and phase of the sampled AC powerline voltage are adjusted to create a fundamental frequency correction signal, At step 630, a signal at a harmonic of the AC powerline voltage is generated by reading out the ring memory buffer at a rate that is effectively three times the sample rate. At step 640, amplitude and phase of the signal at the harmonic of the AC powerline voltage are adjusted to to create a harmonic correction signal. At step 650, the fundamental and harmonic correction signals are combined (e.g., summed) to produce a combined correction signal. At step 660, the combined correction signal is applied to a bending magnet in the EELS. In a further embodiment of the method, the correction signal is applied to a drift tube in the EELS.

Figure 5:
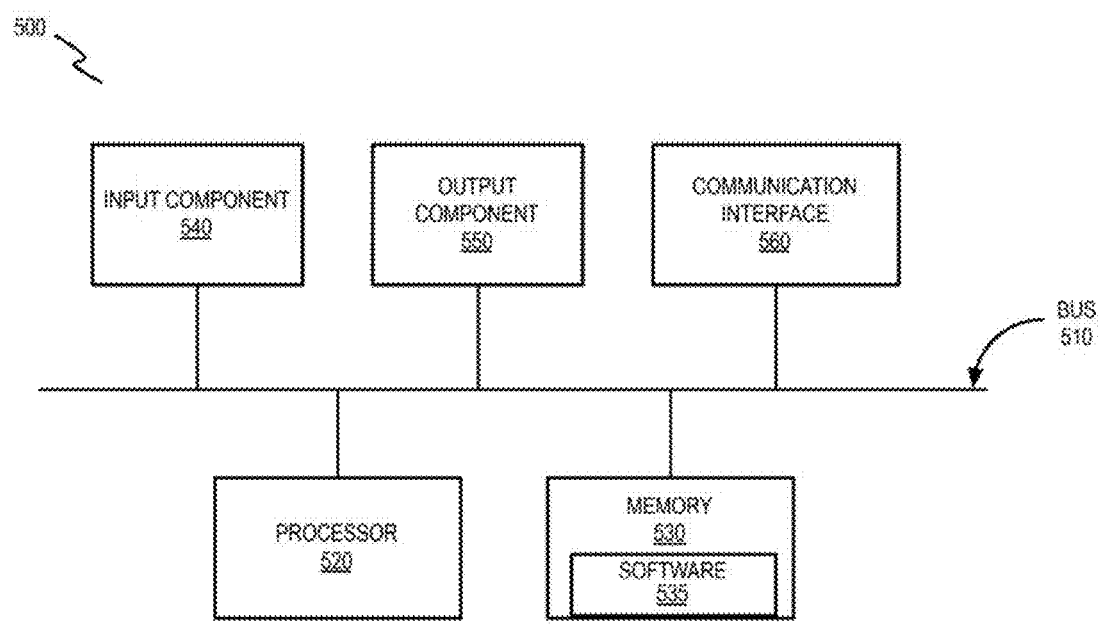
FIG. 5 is a block diagram of an exemplary system.

FIG. 5 is a diagram illustrating exemplary physical components of a device 500. Device 500 may correspond to various devices within the above-described system, such as the EELS system, a host computer, etc. Device 500 may include a bus 510, a processor 520, a memory 530, an input component 540, an output component 550, and a communication interface 560.

Bus 510 may include a path that permits communication among the components of device 500. Processor 520 may include a processor, a microprocessor, or processing logic that may interpret and execute instructions. Memory 530 may include any type of dynamic storage device that may store information and instructions, for execution by processor 520, and/or any type of non-volatile storage device that may store information for use by processor 520.

Software 535 includes an application or a program that provides a function and/or a process. Software 535 is also intended to include firmware, middleware, microcode, hardware description language (HDL), and/or other form of instruction. By way of example, with respect to the network elements that include logic to provide proof of work authentication, these network elements may be implemented to include software 535. Additionally, for example, device 500 may include software 535 to perform tasks as described above with respect to FIG. 4.

Input component 540 may include a mechanism that permits a user to input information to device 500, such as a keyboard, a keypad, a button, a switch, etc. Output component 550 may include a mechanism that outputs information to the user, such as a display, a speaker, one or more light emitting diodes (LEDs), etc.

Communication interface 560 may include a transceiver that enables device 500 to communicate with other devices and/or systems via wireless communications, wired communications, or a combination of wireless and wired communications. For example, communication interface 560 may include mechanisms for communicating with another device or system via a network. Communication interface 560 may include an antenna assembly for transmission and/or reception of RF signals. In one implementation, for example, communication interface 560 may communicate with a network and/or devices connected to a network. Alternatively or additionally, communication interface 560 may be a logical component that includes input and output ports, input and output systems, and/or other input and output components that facilitate the transmission of data to other devices.

Device 500 may perform certain operations in response to processor 520 executing software instructions (e.g., software 535) contained in a computer-readable medium, such as memory 530. A computer-readable medium may be defined as a non-transitory memory device. A non-transitory memory device may include memory space within a single physical memory device or spread across multiple physical memory devices. The software instructions may be read into memory 530 from another computer-readable medium or from another device. The software instructions contained in memory 530 may cause processor 520 to perform processes described herein. Alternatively, hardwired circuitry may be used in place of or in combination with software instructions to implement processes described herein. Thus, implementations described herein are not limited to any specific combination of hardware circuitry and software.

Device 500 may include fewer components, additional components, different components, and/or differently arranged components than those illustrated in FIG. 5. As an example, in some implementations, a display may not be included in device 500. In these situations, device 500 may be a "headless" device that does not include input component 540. As another example, device 500 may include one or more switch fabrics instead of, or in addition to, bus 510. Additionally, or alternatively, one or more components of device 500 may perform one or more tasks described as being performed by one or more other components of device 500.

Although different implementations have been described above, it is expressly understood that it will be apparent to persons skilled in the relevant art that the implementations may be modified without departing from the spirit of the invention. For example, while a third harmonic correction signal is described, the system describe can also be used to generate and correct for any other harmonics of the line frequency that may be present and affecting the EELS bending magnet or drift tube. Various changes of form, design, or arrangement may be made to the invention without departing from the spirit and scope of the invention. Therefore, the above mentioned description is to be considered exemplary, rather than limiting, and the true scope of the invention is that defined in the following claims.

It should be emphasized that the term "comprises/comprising" when used in this specification is taken to specify the presence of stated features, integers, steps or components but does not preclude the presence or addition of one or more other features, integers, steps, components, or groups thereof.

No element, act, or instruction used in the present application should be construed as critical or essential to the implementations described herein unless explicitly described as such. Also, as used herein, the article "a" is intended to include one or more items. Further, the phrase "based on" is intended to mean "based, at least in part, on" unless explicitly stated otherwise.

What is claimed is:

1. An electron energy loss spectrometer (EELS) operating from an alternating current (AC) power line voltage having an AC power line fundamental frequency comprising:
    a bending magnet for producing a spectrum of electron energy levels;
    a direct current bending magnet field excitation source; and
    a power line noise correction circuit configured to produce a first correction signal at the fundamental AC power line frequency and a second correction signal at a harmonic of the fundamental AC power line frequency.

2. The EELS of claim 1, wherein said power line noise correction circuit includes a sampling circuit for sampling the AC power line voltage.

3. The EELS of claim 1, wherein said power line noise correction circuit includes an electromagnetic field sensing sampling circuit for indirectly sensing AC power line noise in the vicinity of the EELS.

4. The EELS of claim 1, wherein said second correction signal at said harmonic of the fundamental AC power line frequency is generated independent of the AC power line voltage.

5. The EELS of claim 1, wherein said second correction signal at said harmonic of the fundamental AC power line frequency is produced by waveshaping and filtering either the AC power line signal or a signal proportional to a sensed electromagnetic field at the AC power line frequency.

6. The EELS of claim 1, wherein each of the first and second correction signals are independently adjustable in phase and amplitude.

7. The EELS of claim 1, wherein each of said first and second correction signals are electrically added to said DC bending magnet field excitation source.

8. The EELS of claim 1, wherein each of said first and second correction signals are coupled to said bending magnet field excitation source with a transformer.

9. The EELS of claim 1, further comprising a drift tube and wherein amplitude and phase-adjusted versions of said first correction signal and said second correction signal are applied to a DC voltage powering said drift tube.

10. The EELS of claim 1, wherein said power line noise correction circuit comprises:
    an analog to digital signal converter;
    a microcontroller; and
    a digital to analog signal converter,
    wherein said microcontroller controls said analog to digital signal converter to:
        sample the AC powerline voltage, and
        store said samples in a buffer and output said samples from said buffer to said digital to analog signal converter, such that there are produced a fundamental frequency output signal and a harmonic of said fundamental output signal based on said samples of the AC powerline voltage.

11. The EELS of claim 10, wherein said harmonic is the third harmonic of the fundamental AC powerline frequency.

12. An alternating current (AC) power line noise correction circuit for producing a correction signal comprising a fundamental AC power line frequency signal and a harmonic of the fundamental AC power line frequency signal, comprising:
    a line voltage sensor configured to produce a line voltage signal;
    an analog to digital (A/D) signal converter;
    a microcontroller having a program memory and a read/write buffer memory; and
    a digital to analog (D/A) signal converter;
    wherein said microcontroller is configured to
        sample said line voltage signal at a sample rate,
        store samples of said line voltage signal in said read/write buffer memory,
        read out said samples of said line voltage signal from said read/write buffer memory to create a first read out at said AC power line frequency and a second read out a harmonic of said AC power line frequency,
        combine said first and second readouts to produce a combined output value, and
        output said combined output value to said D/A converter to produce a combined correction signal.

13. The AC power line noise correction circuit of claim 12, wherein said microcontroller is further configured to phase shift one or both of said first and second readouts from said line voltage signal.

14. The AC power line noise correction circuit of claim 12, wherein said microcontroller is further configured to provide individual adjustment of amplitude of one or both of said first and second readouts from said line voltage signal.

15. The AC power line noise correction circuit of claim 12, wherein said harmonic is the third harmonic of said line voltage frequency.

16. The AC power line noise correction circuit of claim 12, wherein said line voltage sensor is a transformer.

17. The AC power line noise correction circuit of claim 12, wherein said line voltage sensor is an electromagnetic field sensor.

18. An electron energy loss spectrometer (EELS) subject to noise associated with an AC power source comprising:
   a bending magnet supplied by a bending magnet excitation current; and
   the alternating current (AC) power line noise correction circuit of claim 12,
   wherein said combined correction signal is applied to said bending magnet excitation current to correct for the noise associated with an AC power source.

19. The method of claim 18, further comprising:
   Automatically adjusting one or both of said amplitude and phase of one or both of said fundamental and said harmonic correction signals based on feedback from a spectrum detected by the EELS.

20. A method of correcting for AC mains noise in an electron energy loss spectrometer (EELS) comprising the steps of:
   sampling an AC power line voltage,
   adjusting amplitude and phase of the AC power line voltage to create a fundamental frequency correction signal,
   generating a signal at a harmonic of the AC powerline voltage,
   adjusting amplitude and phase of said signal at the harmonic of the AC powerline voltage to create a harmonic correction signal and
   applying said fundamental and said harmonic correction signal to a bending magnet in the EELS).

* * * * *